(12) United States Patent
Shafer et al.

(10) Patent No.: US 6,560,031 B1
(45) Date of Patent: May 6, 2003

(54) OPTICAL PROJECTION LENS SYSTEM

(75) Inventors: David R. Shafer, Fairfield, CT (US); Wilhelm Ulrich, Aalen (DE)

(73) Assignee: Carl-Ziess-Stiftung, Heidenheim (DE)

( * ) Notice: Subject to any disclaimer, the term of this patent is extended or adjusted under 35 U.S.C. 154(b) by 50 days.

(21) Appl. No.: 09/694,878

(22) Filed: Oct. 23, 2000

Related U.S. Application Data

(60) Provisional application No. 60/160,799, filed on Oct. 21, 1999.

(51) Int. Cl.[7] .................................................. G02B 3/00
(52) U.S. Cl. ........................ 359/649; 359/754; 359/683
(58) Field of Search ................................ 359/649, 682, 359/683, 690, 754, 784, 785, 708

(56) References Cited

U.S. PATENT DOCUMENTS 6,198,576 B1 * 3/2001 Matsuyama ................ 359/649
6,349,005 B1 * 2/2002 Schuster et al. ............ 359/754

FOREIGN PATENT DOCUMENTS

| DE | 198 18 444 A | 10/1998 |
| EP | 0 816 892 A | 1/1998 |
| JP | 10 325922 | 12/1998 |
| JP | 11 095095 | 4/1999 |

OTHER PUBLICATIONS

European Search Report dated Jun. 19, 2001.

* cited by examiner

*Primary Examiner*—Georgia Epps
*Assistant Examiner*—M. Hasan

(57) ABSTRACT

An optical projection lens system comprising in direction of propagating radiation: a first lens group having positive refractive power, a second lens group having negative refractive power and comprising a waist with a minimum diameter of the propagating radiation, and a further lens arrangement with positive refracting power, which follows the second lens group, wherein at least one lens of the projection lens system, which is arranged in front of the waist comprises an aspherical surface.

10 Claims, 1 Drawing Sheet

OPTICAL PROJECTION LENS SYSTEM

CROSS-REFERENCES TO RELATED APPLICATIONS

This application claims the benefit of No. 60/160,799, filed Oct. 21, 1999.

STATEMENT REGARDING FEDERALLY SPONSORED RESEARCH OR DEVELOPMENT

Not applicable.

BACKGROUND OF THE INVENTION

1. Field of the Invention

This invention generally relates to an optical projection system comprising a light source, a mask holder, a projection lens system, and specifically relates to an optical projection system for photolithogaphy used in producing microstructured devices such as integrated circuits or other semiconductor devices. During the fabrication of such devices photolithography transfers an image from a photographic mask to a resultant pattern on a semiconductor wafer. Such photolithography generally includes alight exposure process, in which a semiconductor wafer is exposed to light having information of a mask pattern. Optical projection systems are used to perform the light exposure process.

In general, the transferred mask patterns are very fine, so that optical projection lens systems are required to have a high resolution. The high resolution necessitates a large numerical aperture of the optical projection lens system and also a nearly no aberration of the optical projection lens system in the light exposure field.

2. Related Prior Art

For example, some projection lens systems are proposed in the German Patent Application DE 198 18 444 A1. The shown projection lens system comprises 6 lens groups. The first, third, fifth and sixth lens groups have positive refractive power and the second and fourth lens groups have negative refractive power. To get a high resolution in all shown examples, aspherical surfaces are in the fourth and fifth lens groups.

Some purely refractive projection exposure objectives of microlithography are discussed in SPIE Vol. 237 (1980) page 310 ff. There are shown objectives of the planar style and the distagon style, wherein the new style of objective comprises two waists for setzval correction.

SUMMARY OF THE INVENTION

It is an object of this invention to provide a further excellent optical projection lens system for photolithography.

The optical projection lens system of the invention comprises in a direction of the light a first lens group having positive refractive power and a second lens group having negative refractive power and establishing a beam waist of minimal beam height. A further lens arrangement follows the second lens group. At least one lens, which is arranged before first beam waist, has an aspherical surface. Further, lenses comprising aspherical surfaces in all other groups will be helpful to reduce the needed amount of material and to reduce the length of the optical projection lens system.

Figure 1:
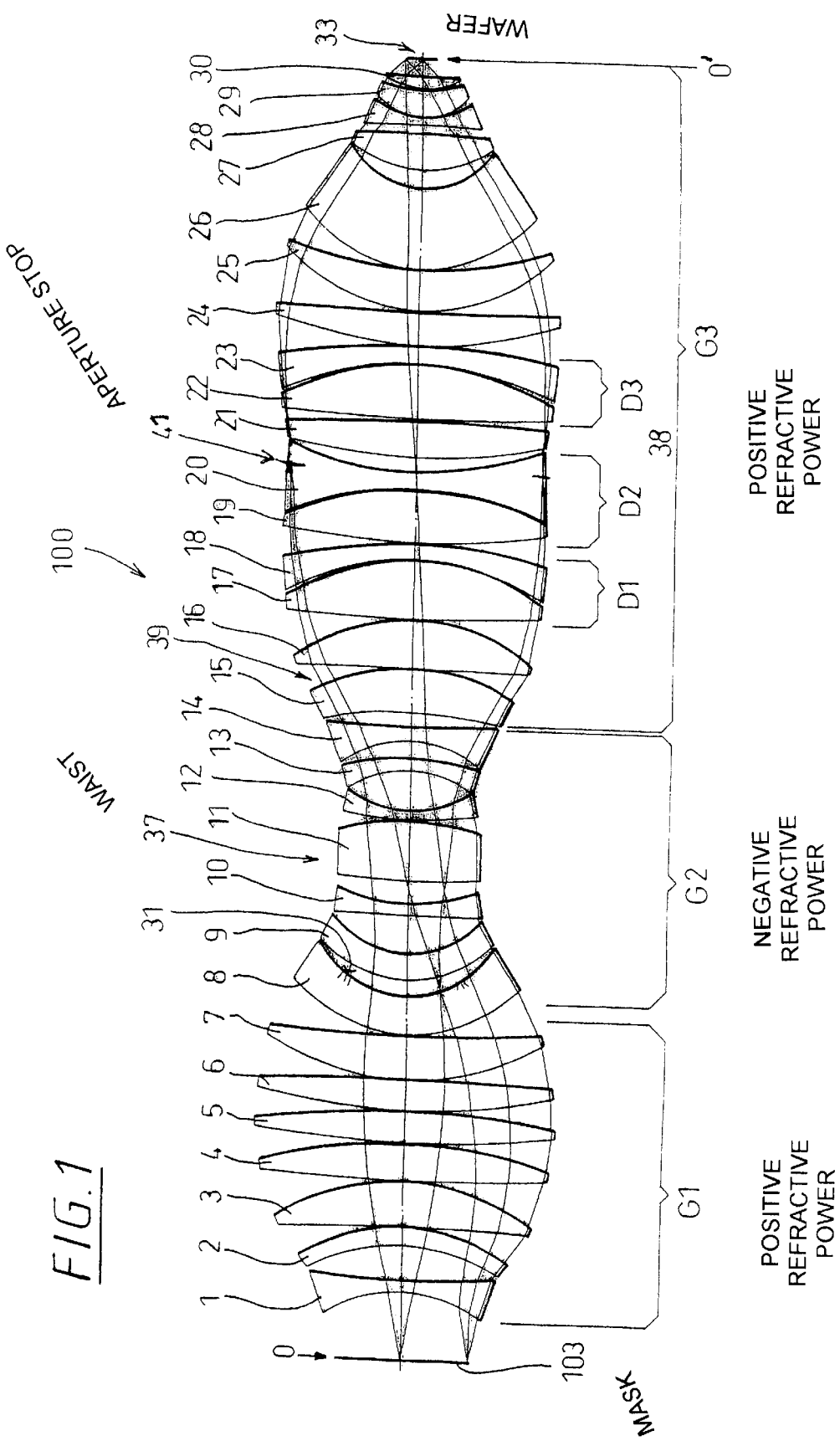
FIG. 1 is a cross section of an optical projection lens system according to an embodiment of the invention with only one clearly defined waist.

The optical projection lens system, shown in FIG. 1 comprises 30 lenses 1–30. This shown projection lens system is for wafer manufacture. For illuminating a mask 103, which is positioned at 0, a light source with a narrow bandwidth is used. In this example, an excimer laser, which is not shown in the drawing, is used. The shown projection lens system is capable to be operated at 193.3. nm with a high numerical aperture of 0.7. This projection lens system is also adaptable to be operated at $\lambda=248$ nm or $\lambda 157$ nm.

A projection system comprising with this projection lens system the scale of the mask 103 projected on a wafer is reduced, wherein the wafer is positioned on 0'. The factor of scale reduction in 4 and the distance of 0 to 0' is 1000 nm. The illuminated image field is rectangular, e.g. 7×15×30 $mm^2$.

The present invention will be more fully understood from the detailed description given below and the accompanying drawing.

In direction of propagating radiation this projection, lens system comprises a first lens group G1 comprising lenses 1 to 7 and a second lens group G2 comprising 8 to 14, and a further lens arrangement G3 comprising lenses 15 to 30. The first lens group G1, has positive refractive power and ends with a lens 7 of refractive power.

The first lens 8 of the second lens group G2 is the first lens 8 behind the first belly of the projection lens system 100, which has a concave shaped lens surface 31 on the image side. In the shown example, this concave surface 31 has an aspherical shape. This aspherical surface 31 helps to reduce the track length, the number of needed lenses and to get a high image quality over the whole illuminated image field.

This second lens group G2 has negative refractive power and comprises a clearly defined waist 37, which comprises seven lenses. The high number of lenses are needed for petzval correction, because there, is only one clearly defined waist. There are three negative lenses 8–10 arranged in front of a lens 11 of positive refractive power in the middle of the lens group G2. Behind this positive lens 11 there are further three negative lenses 12–15.

The first lens 15 of the following lens arrangement G3 has positive refractive power. This is the first lens 15 of positive refractive power behind the lens 11 in the middle of the lens group G2. This lens arrangement G3 has positive refractive power and comprises lenses 15–30 of different materials and an aperture stop 41.

Especially $CaF_2$ lenses 16, 17, 19, 21, 22, 29 and 30 are used. The other lenses are of quartz glass. These $CaF_2$ lenses are especially used for correction of chromatic aberration. This system comprises doublets D1, D2 and D3, which comprise a $CaF_2$ lens with positive refractive power followed by a quartz glass lens of negative refractive power. If no correction of chromatic aberration is required, as usual in 248 nm systems, or possible with very narrow laser bandwidth, there can be taken single lenses of the doublets D1–D3 with the advantage of reducing the needed material and lenses.

A very shallow waist 38 is recognizable between lens 20 and lens 21.

The lens arrangement G3 has an maximal diameter of 238 mm.

The lens data of this embodiment are listed in table 1. The aspheric surface is described mathematically by:

$$P(h) = \frac{\delta * h^2}{1 + \sqrt{1 - (1 - EX) * \delta^2 * h^2}} + C_1 h^4 + \ldots + C_n h^{2n+2}$$

with $\delta = 1/R$, wherein R is paraxial curvature and P is the sag as a function of the radius h.

The maximal beam diameter is 238 mm ad the track length is 1000 mm, wherein the numerical aperture is NA=0.7. This effects a very compact construction with reduced cost for lens material.

The implementation of $CaF_2$ lenses 16, 11, 19, 21, 22 effects a good correction of chromatic aberration of this compact embodiment. The last two $CaF_2$ lenses 29, 30 at the end of the lens arrangement G3 are inserted for their resistance versus compaction.

As those skilled in the art of optical projection lens systems will readily appreciate numerous substitutions, modifications and additions may me made to the above design without departing from the spirit and scope of the present invention. It is intended that all such substitutions, modifications, and additions fall within the scope of the invention, which is defined by the claims.

We claim:

1. An optical projection lens system for microlithography, comprising in a direction of propagating radiation:

a first lens group having positive refractive power;

a second lens group having negative refractive power and comprising a constriction portion with a minimum diameter of the propagating radiation, and a further lens arrangement with positive refractive power, which follows said second lens group, wherein the optical projection lens system comprises only one clearly defined constriction portion and wherein at least one lens comprises an aspherical surface.

2. The optical projection lens system according to claim 1, comprising lenses comprising a first lens material and lenses which comprise at least a second lens material used for chromatic correction.

3. The optical projection lens system according to claim 1, comprising lenses comprising a first material comprising quartz glass and lenses comprising a second material comprising fluoride.

4. The optical projection lens system according to claim 3, comprising an aperture stop, wherein the optical projection lens system comprises positive lens elements consisting of a second material nearby the aperture stop.

5. The optical projection lens system according to claim 3, comprising lenses of a first lens material comprising quartz glass and lenses comprising a second lens material comprising fluoride.

6. The optical projection lens system according to claim 3, comprising lenses comprising a first lens material comprising quartz glass and lenses comprising a second lens material comprising fluoride.

7. The optical projection lens system according to claim 1, wherein the optical projection lens system comprises only two convex portions.

8. An optical projection lens system for microlithography, comprising in a direction of propagation radiation:

a first lens group having positive refractive power, a second lens group having negative refractive power and comprising a constriction portion with a minimum diameter of the propagating ray, a further lens arrangement with positive refracting power, which follows said second lens group, wherein the projection lens system comprises only one clearly defined constriction portion, and wherein the numerical aperture is greater than 0.65.

9. A process for producing microstructured devices, comprising from an object side to an image side exposing a wafer with a light sensitive layer with UV-light using an optical projection lens system, comprising a first lens group having positive refractive power, a second lens group having negative refractive power and comprising a constriction portion with a minimum diameter of the propagating radiation, and a further lens arrangement with positive refracting power, which follows said second lens group, wherein the optical projection lens system comprises only one clearly defined constriction portion and wherein at least one lens comprises an aspherical surface, using a mask for defining the structure of the device, and developing the light sensitive layer to obtain the microstructured device.

10. A process for producing microstructured devices, comprising from an object side to an image side exposing a wafer with a light sensitive layer with UV-light using an optical projection lens system, comprising a first lens group having positive refractive power, a second lens group having negative refractive power and comprising a constriction portion with a minimum diameter of the propagating ray, a further lens arrangement with positive refracting power, which follows said second lens group, wherein the projection lens system comprises only one clearly defined constriction portion, and wherein the numerical aperture is greater than 0.65, using a mask for defining the structure of the device, and developing the light sensitive layer to obtain the microstructured device.

* * * * *

UNITED STATES PATENT AND TRADEMARK OFFICE
CERTIFICATE OF CORRECTION

PATENT NO.    : 6,560,031 B1                                    Page 1 of 1
DATED         : May 6, 2003
INVENTOR(S)   : Shafer et al.

It is certified that error appears in the above-identified patent and that said Letters Patent is hereby corrected as shown below:

<u>Title page,</u>
Item [73], Assignee, change "Carl Ziess-Stiftung" to -- Carl Zeiss Stiftung --

<u>Column 2,</u>
Line 13, change "1000 nm" to -- 1000 mm --
Line 14, change "7 x 15 x 30" to -- 7x 20 to 15 x 30 --

<u>Column 3,</u>
Following line 7, insert the following -- Table 1(2 pages). --

Signed and Sealed this

Thirteenth Day of April, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,560,031 B1
APPLICATION NO. : 09/694878
DATED : May 6, 2003
INVENTOR(S) : David R. Shafer and Wilhelm Ulrich It is certified that error appears in the above-identified patent and that said Letters Patent is hereby corrected as shown below:

Column 1, line 22, change "alight" to -- a light --.

Column 2, line 7, change "193.3." to -- 193.3 --; line 9, change "$\lambda 157$" to -- $\lambda = 157$ --; line 19, change "projection, lens" to -- projection lens --; line 35, change "there, is" to -- there is --; line 59, change "has an maximal" to -- has a maximal --.

Column 3, following line 3, insert the following

--

TABLE 1

| LENS | RADIUS | THICKNESS | GLASS |
|------|--------|-----------|-------|
|      | UNENDL | 17.52     |       |
| L1   | -116.39 | 10.00    | $SiO_2$ |
|      | 617.53 | 31.49     |       |
| L2   | -143.96 | 15.00    | $SiO_2$ |
|      | -158.71 | 0.50     |       |
| L3   | -1180.69 | 37.72  | $SiO_2$ |
|      | -191.12 | 0.50     |       |
| L4   | 2484.02 | 31.18    | $SiO_2$ |
|      | -409.87 | 0.50     |       |
| L5   | 864.05 | 28.13     | $SiO_2$ |
|      | -720.08 | 0.50     |       |

UNITED STATES PATENT AND TRADEMARK OFFICE
CERTIFICATE OF CORRECTION

PATENT NO. : 6,560,031 B1
APPLICATION NO. : 09/694878
DATED : May 6, 2003
INVENTOR(S) : David R. Shafer and Wilhelm Ulrich It is certified that error appears in the above-identified patent and that said Letters Patent is hereby corrected as shown below:

| | | | |
|---|---|---|---|
| L6 | 566.89 | 25.00 | $SiO_2$ |
| | -5256.53 | 0.50 | |
| L7 | 230.42 | 36.66 | $SiO_2$ |
| | 1542.90 | 0.50 | |
| L8 | 132.99 | 31.60 | $SiO_2$ |
| | 84.39 | 12.54 | |
| L9 | 101.03 | 22.70 | $SiO_2$ |
| | 80.07 | 30.80 | |
| L10 | -7281.27 | 10.00 | $SiO_2$ |
| | 139.12 | 20.25 | |
| L11 | 962.49 | 53.36 | $SiO_2$ |
| | -190.49 | 0.50 | |
| L12 | 348.09 | 9.00 | $SiO_2$ |
| | 96.42 | 32.28 | |
| L13 | -94.72 | 11.00 | $SiO_2$ |
| | -203.97 | 14.37 | |
| L14 | -91.49 | 13.00 | $SiO_2$ |
| | 4787.89 | 10.28 | |
| L15 | -329.06 | 36.69 | $SiO_2$ |
| | -173.40 | 0.50 | |
| L16 | -2176.02 | 40.00 | $CaF_2$ |
| | -161.94 | 1.00 | |
| L17 | 1885.09 | 50.00 | $CaF_2$ |
| | -195.36 | 0.48 | |
| L18 | -198.97 | 15.00 | $SiO_2$ |

UNITED STATES PATENT AND TRADEMARK OFFICE
CERTIFICATE OF CORRECTION

PATENT NO.       : 6,560,031 B1
APPLICATION NO. : 09/694878
DATED            : May 6, 2003
INVENTOR(S)      : David R. Shafer and Wilhelm Ulrich It is certified that error appears in the above-identified patent and that said Letters Patent is hereby corrected as shown below:

|     |           |        |        |
|-----|-----------|--------|--------|
|     | -389.14   | 0.50   |        |
| L19 | 687.29    | 45.10  | $CaF_2$ |
|     | -254.11   | 0.10   |        |
| L20 | -261.96   | 15.00  | $SiO_2$ |
|     | 261.17    | 13.27  |        |
| L21 | 530.40    | 32.00  | $CaF_2$ |
|     | -1166.11  | 0.50   |        |
| L22 | 1879.17   | 45.00  | $CaF_2$ |
|     | -237.88   | 0.10   |        |
| L23 | -271.21   | 15.00  | $SiO_2$ |
|     | -609.73   | 0.50   |        |
| L24 | 351.48    | 30.00  | $SiO_2$ |
|     | 100200.00 | 0.50   |        |
| L25 | 157.95    | 34.26  | $SiO_2$ |
|     | 329.33    | 0.50   |        |
| L26 | 125.26    | 67.46  | $SiO_2$ |
|     | 69.91     | 16.27  |        |
| L27 | 102.35    | 30.27  | $SiO_2$ |
|     | -1072.95  | 7.25   |        |
| L28 | -914.82   | 5.00   | $SiO_2$ |
|     | 63.74     | 0.50   |        |
| L29 | 53.45     | 23.33  | $CaF_2$ |
|     | 82.67     | 0.50   |        |
| L30 | 60.16     | 10.70  | $CaF_2$ |
|     | 1256.42   | 15.34  |        |

UNITED STATES PATENT AND TRADEMARK OFFICE
CERTIFICATE OF CORRECTION

PATENT NO. : 6,560,031 B1
APPLICATION NO. : 09/694878
DATED : May 6, 2003
INVENTOR(S) : David R. Shafer and Wilhelm Ulrich It is certified that error appears in the above-identified patent and that said Letters Patent is hereby corrected as shown below:

Aspheric Constants $EX = 0.139140 * 10^{-8}$ $C_1 = 0.178710 * 10^{-12}$ $C_2 = 0.601290 * 10^{-17}$ $C_3 = 0.253200 * 10^{-20}$ --.

Column 3, line 4, change "ad" to -- and --; following line 7, delete the previous insertion "Table 1 (2 pages)"; line 8, change "11" to "17"; line 15, change "me" to -- be --.

Signed and Sealed this

Eleventh Day of September, 2007

JON W. DUDAS
*Director of the United States Patent and Trademark Office*